United States Patent
Corvasce et al.

[11] Patent Number: 6,130,812
[45] Date of Patent: *Oct. 10, 2000

[54] PROTECTION CIRCUIT FOR HIGH SPEED COMMUNICATION

[75] Inventors: Giorgio Corvasce; Luca Calcaterra, both of Rome, Italy

[73] Assignee: Telefonaktiebolaget LM Ericsson, Stockholm, Sweden

[ * ] Notice: This patent issued on a continued prosecution application filed under 37 CFR 1.53(d), and is subject to the twenty year patent term provisions of 35 U.S.C. 154(a)(2).

[21] Appl. No.: 09/142,071
[22] PCT Filed: Feb. 26, 1997
[86] PCT No.: PCT/SE97/00324
  § 371 Date: Dec. 28, 1998
  § 102(e) Date: Dec. 28, 1998
[87] PCT Pub. No.: WO97/33371
  PCT Pub. Date: Sep. 12, 1997

[30] Foreign Application Priority Data

Mar. 8, 1996 [SE] Sweden .................................. 9600925

[51] Int. Cl.[7] ........................... H02H 3/18; H03K 19/086
[52] U.S. Cl. ........................... 361/82; 307/127; 307/146; 327/325; 333/12; 333/24 R
[58] Field of Search ..................................... 361/107, 117, 361/119, 111, 82, 84, 86; 379/416, 412; 307/127, 146; 326/30, 33, 90, 133; 327/504, 993, 320, 321, 325; 320/165; 333/12, 24 R

[56] References Cited

U.S. PATENT DOCUMENTS

| | | |
|---|---|---|
| 3,617,771 | 11/1971 | Lee .......................................... 327/379 |
| 4,321,429 | 3/1982 | Takatsuki et al. ................... 379/93.09 |
| 4,408,248 | 10/1983 | Bulley et al. . |
| 4,661,878 | 4/1987 | Brown et al. .............................. 361/56 |
| 5,087,833 | 2/1992 | Sugai . |
| 5,335,134 | 8/1994 | Stein et al. . |
| 5,541,527 | 7/1996 | Hae-Ting Ma . |
| 5,640,127 | 6/1997 | Metz ....................................... 330/298 |

FOREIGN PATENT DOCUMENTS

| | | |
|---|---|---|
| 0441126A2 | 8/1991 | European Pat. Off. . |
| 0441126A2 | 12/1991 | European Pat. Off. . |
| 0685916A2 | 12/1995 | European Pat. Off. . |
| 0685916A3 | 7/1996 | European Pat. Off. . |

*Primary Examiner*—Josie Ballato
*Assistant Examiner*—Kim Huynh
*Attorney, Agent, or Firm*—Burns, Doane, Swecker & Mathis, L.L.P.

[57] ABSTRACT

Provided is a protection circuit for high speed signal communication via a two-wire connection between the two output terminals of a PECL driver and the two input terminals of a PECL receiver. The PECL driver and receiver are supplied with power from individual power supplies. The protection circuit includes two diodes connected in series with a respective wire with their cathodes electrically coupled to the respective output terminal of the PECL driver and their anodes electrically coupled to the respective input terminal of the PECL receiver, and two resistors connected between the PECL receiver power supply and the anodes of the respective diode. The resistance of the resistors ensures forward biasing of the diodes when the receiver power supply is supplying power. A capacitor may be connected in parallel with the respective diodes.

14 Claims, 1 Drawing Sheet

PROTECTION CIRCUIT FOR HIGH SPEED COMMUNICATION

TECHNICAL FIELD OF THE INVENTION

The present invention relates to a protection circuit for high speed signal communication using PECL (Positive Emitter Coupled Logic) technology.

DESCRIPTION OF RELATED ART

ECL (Emitter Coupled Logic) devices are employed in systems requiring very fast signal processing since the power dissipation of ECL devices is constant over a wide signal frequency range. ECL devices are especially attractive for driving long transmission lines and for reduction of system clock skew (see "Designing with PECL (ECL at +5.0V)", Motorola Application Note AN1406). Integrating ECL devices in conventional TTL (Transistor—Transistor Logic)/CMOS (Complementary Metal Oxide Semiconductor) design is sometimes desirable. Then it is advantegous to use PECL (Positive Emitter Coupled Logic) devices. PECL devices are ECL devices supplied by a positive (+5V) power supply. Thus, PECL devices can be implemented using the same power supplies as TTL/CMOS devices.

PECL devices are often employed in differential applications such as differential PECL driver-receiver connections as they comprise a differential amplifier input structure and complementary outputs. One possible problem with a PECL driver-receiver connection is when the driver is supplied with power while the receiver is not supplied with power. The base-collector junctions of the input transistors of the PECL receiver will be forward biased and consequently conduct current, which current can be very high (depending on the resistance of the collector load resistor). This will lead to high power dissipation in the driver and also a risk for damages in the driver as well as in the receiver.

SUMMARY OF THE INVENTION

The object of the invention is to eliminate the problem with the large power dissipation and the risk for damages in the driver due to the currents flowing towards the receiver and for receiver degradation due to high currents flowing in the base-collector junctions of the differential pair input transistors of the receiver.

This is accomplished with a protection circuit which, according to the invention, comprises a simple passive network consisting of two diodes and two resistors. The diodes are connected in the respective wire between the driver and the receiver and in such manner that when the power supply of the receiver is switched off, the diodes are reverse biased and effectively block all current flow from the driver to the receiver. When the power supply of the receiver is switched on, the diodes are forward biased, which is accomplished in that the resistors are connected between the receiver power supply and the respective diode.

The diodes are interconnected in the respective wire with the cathodes of the diodes connected to the respective output terminal of the PECL driver and the anodes of the diodes connected to the respective input terminal of the PECL receiver, and the resistors connected between the PECL receiver power supply and the anode of the respective diode. If the driver transmits signals over e.g. a transmission line the diodes are preferably connected between the driver and the transmission line.

The protection circuit according to the invention avoids the problems mentioned above by effectively blocking all DC current flow from the driver to the receiver.

An advantage of the invention is that it is easy to implement.

A further advantage of the invention is that it is applicable with both series and parallel termination scheme.

Yet another advantage is that a protection against short circuits is provided when connecting the diodes between the respective output terminal of the PECL driver and the respective wire of the transmission line.

Still another advantage of the invention is that mismatching problems in the transmission line can be avoided when connecting a first and a second capacitor in parallel with the respective diode. Hence, the circuit does not introduce any modification in the propagation of the signals.

BRIEF DESCRIPTION OF THE DRAWINGS

The invention will be described in greater detail below with reference to appended drawing.

DETAILED DESCRIPTION OF EMBODIMENTS

Figure 1:
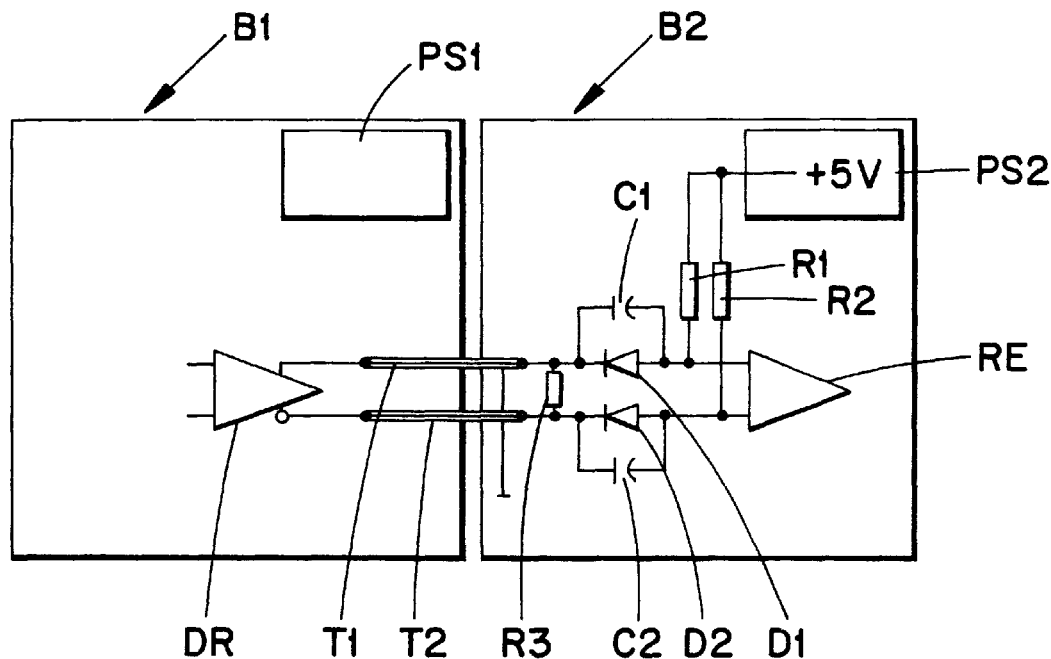
FIG. 1 shows, in a schematic circuit diagram, a first embodiment of a protection circuit according to the invention.

In FIG. 1 is shown a PECL driver DR with complementary outputs. The driver is transmitting high frequency signals to a PECL receiver RE via a two-wire connection T1, T2, e.g. a transmission line with a known impedance. Hereafter the two-wire connection T1, T2 will be referred to as a transmission line. The driver DR and receiver RE are arranged on different boards B1 and B2, respectively. The two-wire transmission line T1, T2 as shown in FIG. 1 is designed for arbritary long transmission lines. The receiver and driver are supplied with power from individual power supplies PS1, and PS2 located on the respective board B1, B2. In FIG. 1 a resistor R3 (normally 100 Ω) is shown interconnected between the wires T1, T2 to indicate a parallel termination of the driver.

The protection circuit according to the invention comprises two diodes D1, D2 and two resistors R1, R2.

The diodes D1, D2 are interconnected in the respective wire T1, T2 with their cathodes connected to the respective output terminal of the driver DR and their anodes connected to the respective input terminal of the receiver RE. In such an arrangement with the driver DR powered and the receiver RE unpowered the diodes D1, D2 are reverse biased and prevent current, both static and dynamic, from flowing from the driver DR towards the receiver RE.

The resistors R1, R2 are connected between the receiver board power supply PS2 and the anode of the respective diode D1, D2. This is to ensure forward biasing of the diodes D1, D2 and provide bias currents to the PECL receiver input terminals during normal operation conditions, i.e. when the receiver RE is receiving signals from the driver DR and, consequently, both power supplies PS1 and PS2 are supplying power. To ensure this condition the voltage drop over the diodes D1 and D2 has to be higher than their threshold value $V_\gamma$. Thus, the following relation has to be fulfilled:

$$V_{ino} > V_{outmax} + V_\gamma$$

where $$V_{ino} = V_{CC} - I_{bias} * R$$

$V_{ino}$ being the voltage at the respective input terminal of the receiver RE when it is disconnected from the driver DR, $V_{outmax}$ being the maximum output voltage at the respective output terminal of the driver DR, and $V_y$ being the threshold voltage of the diodes D1 and D2. $V_{cc}$ is the voltage of the power supply PS2, $I_{bias}$ the bias current of the receiver RE, and R the resistance of the respective resistor R1 and R2.

A low threshold voltage of the diodes D1 and D2 is necessary as $V_{ino}$ has to be in the so called common mode range (CMR), i.e. the acceptable range of the logic high voltage level at the respective input terminal of the receiver RE. This VCMR (Voltage in Common Mode Range) is for instance 3–4.4V for a Motorola 100E116 PECL device. Preferably Schottky diodes are employed as they have a low threshold voltage (about 0.3V).

Supposing that Motorola 100E116 PECL devices are used with $V_{cc}$=+5V, $V_{outmax}$=4.1V, and $I_{bias}$=150 μA, the resistance R of the respective resistor R1 and R2 must fulfill the following relations:

$$R<4k\Omega$$

A proper choice in this case would be 2 kΩ to encompass a reasonable margin and ensure current flowing in the diodes.

A capacitor C1, C2 can be connected in parallel with the respective diode D1, D2. Using the capacitors, C1, C2, better signal edges are obtained, i.e. the rise and fall times are reduced. Moreover, impedance steps due to the inserted protection circuit are avoided. When employing the capacitors C1, C2 neither the absolute value nor the stability of the dynamic resistance of the diodes D1, D2 (e.g. temperature stability) is critical. The capacitance of the capacitors C1 and C2 will depend on the application. Tests have been performed with capacitances higher than 10 nF and a signal frequency of approximately 200 MHz with good outcome. However, introducing capacitors, only the static current will be blocked when the receiver board power supply PS2 is not supplying power.

Figure 2:
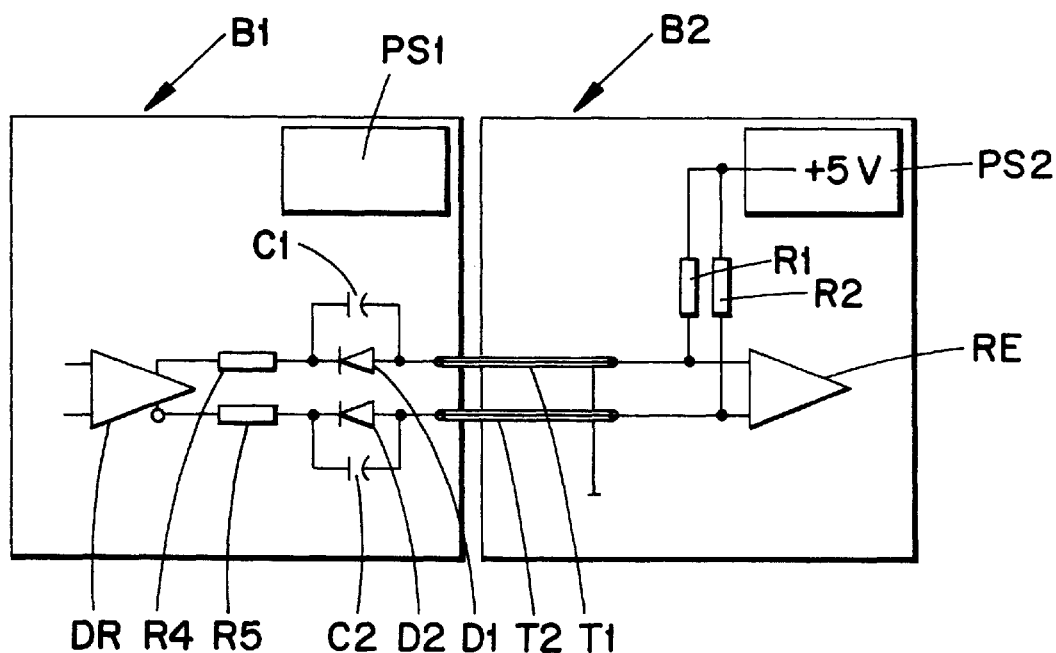
FIG. 2 shows, in a schematic circuit diagram, a second embodiment of a protection circuit according to the invention.

In another similar preferred embodiment, the diodes D1, D2 are arranged on the driver board B1 connecting the respective output terminal of the driver DR to the respective wire T1, T2 of the transmission line as shown in FIG. 2. In FIG. 2 components which are identical with the components in FIG. 1 have been provided with identical reference characters. The respective wire T1, T2 of the transmission line are then connected to the repetive input terminal of the receiver RE and to the power supply PS2 of the receiver board B2 via the resistors R1, R2. The resistances of the resistors R1, R2 are chosen in the same way as in the previous embodiment. Furthermore, a series termination is employed in this embodiment with two resistors R4, R5 interconnected in the respective wire T1, T2 as shown in FIG. 2. The resistances of these resistors R4, R5 are typically 50 Ω.

By this arrangement, also a protection against short circuits in the transmission line is obtained as the reverse biased diodes D1, D2 efficiently block the current from the driver board B1 to the wires T1, T2 of the transmission line.

Also in this embodiment a capacitor C1, C2 can be connected in parallel with the respective diode D1, D2.

The protection circuit is not restricted to a board-to-board communication as in the preferred embodiments described above, but can be implemented in any kind of differential application, e.g. connection of two PECL devices in a single-ended mode with the inverted input connected to a stable reference voltage (not shown).

The protection circuit is also applicable for solving latch-up and electromigration problems in EEL (EriChip-to-EriChip Link) communication. The EEL is an Ericsson proprietary interface with input and output buffers similar to standard PECL, but with a terminating voltage of 3V. Compared to standard PECL the output buffer has lower swing and longer rise and fall time.

The invention can be implemented in various applications, e.g. for driving long transmission lines and for signal communication between two closely located boards through a backplane.

Instead of the termination schemes described in connection with FIG. 1 and FIG. 2, Thevenin schemes or any other kind of termination technique can be used.

What is claimed is:

1. A protection circuit comprising:
   a first diode, having a cathode and an anode, connected in series with a first wire, a first output terminal of a driver, and a first input terminal of a receiver;
   a second diode, having a cathode and an anode, connected in series with a second wire, a second output terminal of the driver, and a second input terminal of the receiver;
   a first resistor; and
   a second resistor,
   wherein said cathode of said first diode is electrically coupled to said first output terminal of the driver and said anode of said first diode is electrically coupled to said first input terminal of the receiver and to a first resistor,
   wherein said cathode of said second diode is electrically coupled to said second output terminal of the driver and said anode of said second diode is electrically coupled to said second input terminal of the receiver and to a second resistor, and
   wherein said first and second resistors are connected to a power supply in order to always forward bias the first and second diodes when the power supply is supplying power, such that said protection circuit blocks substantially all DC current flow from said driver to said receiver.

2. The circuit of claim 1, wherein the first and second wires comprise a transmission line.

3. The circuit of claim 1, wherein said first diode is connected between said first output terminal of the driver and said first wire and wherein said second diode is connected between said second output terminal of the driver and said second wire.

4. The circuit of claim 1, wherein said first diode is connected between said first output terminal of the receiver and said first wire and wherein said second diode is connected between said second output terminal of the receiver and said second wire.

5. The circuit of claim 1, wherein at least one of said first and second diodes are Schottky diodes.

6. The circuit of claim 1, wherein a first capacitor is connected in parallel with said first diode and a second capacitor is connected in parallel with said second diode.

7. The circuit of claim 1, wherein the driver is a PECL driver and the receiver is a PECL receiver.

8. A method for protecting a circuit comprising the steps of:
   supplying power to a first and second input terminals of the receiver, by a power supply;
   connecting a first diode in series with a first wire, said first output terminal of the driver, and said first input terminal of the receiver;
   connecting a second diode in series with a second wire, said second output terminal of the driver, and said second input terminal of the receiver;

electrically coupling a cathode of said first diode to said first output terminal of the driver;

electrically coupling an anode of said first diode to said first input terminal of the receiver and to a first resistor;

electrically coupling a cathode of said second diode to said second output terminal of the driver;

electrically coupling an anode of said second diode to said second input terminal of the receiver and to a second resistor; and electrically coupling said first and second resistors to said power supply in order to always forward bias the first and second diodes when the power supply is supplying power, such that substantially all DC current flow from said driver to said receiver is blocked.

9. The method of claim 8, wherein the first and second wires comprise a transmission line.

10. The method of claim 8, wherein said first diode is connected between said first output terminal of the driver and said first wire and wherein said second diode is connected between said second output terminal and said second wire.

11. The method of claim 8, wherein said first diode is connected between said first output terminal of the receiver and said first wire and wherein said second diode is connected between said second output terminal and said second wire.

12. The method of claim 8, wherein at least one of said first and second diodes are Schottky diodes.

13. The method of claim 8 further comprising the step of connecting, in parallel, a first capacitor with said first diode and a second capacitor with said second diode.

14. The method of claim 8, wherein the driver is a PECL driver and the receiver is a PECL receiver.

* * * * *